(12) United States Patent
Sia et al.

(10) Patent No.: US 7,180,329 B1
(45) Date of Patent: Feb. 20, 2007

(54) LOW-JITTER ADJUSTABLE LEVEL SHIFTER WITH NATIVE DEVICES AND KICKER

(75) Inventors: Ket Chiew Sia, Penang (MY); Choong Kit Wong, Penang (MY); Boon Haw Ooi, Kuala Perlis (MY); Kok Siong Tee, Penang (MY)

(73) Assignee: Altera Corporation, San Jose, CA (US)

( * ) Notice: Subject to any disclaimer, the term of this patent is extended or adjusted under 35 U.S.C. 154(b) by 97 days.

(21) Appl. No.: 11/111,352

(22) Filed: Apr. 20, 2005

(51) Int. Cl.
*H03K 19/0175* (2006.01)

(52) U.S. Cl. .............................. 326/81; 326/68; 326/83

(58) Field of Classification Search .................. 326/68, 326/80–83, 86
See application file for complete search history.

(56) References Cited

U.S. PATENT DOCUMENTS

| | | | |
|---|---|---|---|
| 5,450,357 A | | 9/1995 | Coffman |
| 5,963,054 A | * | 10/1999 | Cochran et al. ............... 326/68 |
| 6,043,699 A | * | 3/2000 | Shimizu ...................... 327/333 |
| 6,087,880 A | | 7/2000 | Takagi |
| 6,433,582 B2 | | 8/2002 | Hirano |
| 6,614,283 B1 | * | 9/2003 | Wright et al. ................ 327/333 |
| 6,646,918 B2 | | 11/2003 | Kurokawa et al. |
| 6,838,924 B1 | | 1/2005 | Davies, Jr. |
| 6,842,043 B1 | * | 1/2005 | Nguyen et al. ................ 326/68 |
| 6,864,718 B2 | * | 3/2005 | Yu .............................. 326/68 |

* cited by examiner

*Primary Examiner*—Rexford Barnie
*Assistant Examiner*—Jason Crawford
(74) *Attorney, Agent, or Firm*—G. Victor Treyz

(57) ABSTRACT

An adjustable level shifter with native and kicker transistors is provided. The level shifter provides high switching speeds, adjustable output voltage levels, and low jitter. The level shifter has first and second thick-oxide p-channel metal-oxide-semiconductor (PMOS) transistors, first and second thick-oxide native n-channel metal-oxide-semiconductor (NMOS) transistors, and first and second thin-oxide NMOS transistors. The first PMOS transistor, first native transistor, and first NMOS transistor are connected in series and the second PMOS transistor, second native transistor, and second NMOS transistor are connected in series. An input data signal and an inverted version of the input data signal drive the gates of the thin-oxide NMOS transistors. A node located between the first PMOS transistor and first native transistor is connected to an output data terminal. The kicker transistor is connected in parallel with the first PMOS transistor.

20 Claims, 7 Drawing Sheets

|  | DELAY (ps) | | JITTER (ps) |
| --- | --- | --- | --- |
|  | Vcc=1.3V | Vcc=0.9V |  |
| RISE | 1269 | 1877 | 608.0 |
| FALL | 1279 | 1891 | 612.0 |

(PRIOR ART)

FIG. 8

|  | DELAY (ps) | | JITTER (ps) |
| --- | --- | --- | --- |
|  | Vcc=1.3V | Vcc=0.9V |  |
| RISE | 1371 | 1719 | 348.0 |
| FALL | 1381 | 1730 | 349.0 |

FIG. 9

LOW-JITTER ADJUSTABLE LEVEL SHIFTER WITH NATIVE DEVICES AND KICKER

BACKGROUND OF THE INVENTION

This invention relates to level shifters, and more particularly, to adjustable level shifters with low jitter.

Level shifting circuits are used to change the voltage range of digital signals. Digital data input signals are received at a level shifter input and corresponding level-shifted digital data output signals are provided at a level shifter output. A level shifter may, for example, convert 1.5 volt input signals to 3.3 volt output signals. Because the maximum voltage of the output data (3.3 volts) is different from the maximum voltage of the input data (1.5 volts), the signal level is said to be "shifted."

Adjustable level shifter circuits are used in environments in which it is desired to provide user control over the output voltage level. In a typical adjustable level shifter arrangement, the level shifter is located on an integrated circuit and has a power supply terminal that is connected to one of the integrated circuit's input pins. During operation of the circuit, a user-defined voltage level is provided to the power supply terminal. This voltage level dictates the output voltage swing of the level shifter. Because the power supply voltage for an adjustable level shifter circuit can be adjusted, the circuitry in an adjustable level shifter must be designed to operate over a range of possible power supply voltages.

It is often necessary for level shifters to operate in high-speed environments in which switching performance is critical. In general, switching speeds should be as fast as possible. Jitter, which is a measure of the pulse-to-pulse timing variation of the output signal, should be as small as possible.

Conventional level shifter circuits often exhibit suboptimal jitter performance and slow switching speeds or are not adjustable.

It would therefore be desirable to be able to provide adjustable level shifter circuitry with improved performance.

SUMMARY OF THE INVENTION

An adjustable integrated circuit level shifter is provided that uses switching circuitry based on a pair of p-channel metal-oxide-semiconductor transistors, a pair of native n-channel metal-oxide-semiconductor transistors, and a pair of thin-oxide n-channel metal-oxide-semiconductor transistors connected in series. The native transistors are thick-oxide devices that have a low-threshold-voltage "always on" characteristic. The p-channel transistors are thick-oxide devices that have cross-coupled gates, so that when one p-channel transistor is on the other p-channel transistor is off. Similarly, when one of the thin-oxide devices is on the other thin-oxide device is off. The thin-oxide devices are protected from damage due to high voltages by the thick-oxide native devices.

The adjustable integrated circuit level shifter has an input terminal, an output terminal, and an adjustable power supply voltage terminal. The input terminal receives digital input data signals having a first voltage swing (e.g., 0–1.2 volts). The output terminal provides corresponding level-shifted output data signals. The magnitude of the voltage swing of the level-shifted output data signals is controlled by adjusting the voltage supplied to the adjustable power supply voltage terminal.

The transistors in the adjustable integrated circuit level shifter each have a gate terminal, a source terminal, and a drain terminal. A first inverter is connected between the input terminal and the gate of a first of the thin-oxide transistors. A second inverter is connected between the output of the first inverter and the input to the second of the thin-oxide transistors.

A delay circuit is connected between the output of the first inverter and the gate of a first of the native devices. The delay circuit may include two cascaded inverters. The delay circuit helps ensure that the shape of the output data pulses is the same as the shape of the input data pulses provided to the level shifter.

A thick-oxide n-channel metal-oxide-semiconductor kicker transistor is connected in parallel with one of the p-channel metal-oxide-semiconductor transistors to help the level shifter pull up the output terminal during low to high data transitions. The kicker transistor gate is connected to the gate of one of the native transistors and the gate of one of the thin-oxide transistors.

The level shifter exhibits low jitter and high switching speeds.

Further features of the invention, its nature and various advantages will be more apparent from the accompanying drawings and the following detailed description of the preferred embodiments.

BRIEF DESCRIPTION OF THE DRAWINGS

FIG. 8 is a table showing the calculated performance of a conventional level shifter of the type shown in FIG. 1.

FIG. 9 is a table showing the calculated performance of a level shifter of the type shown in FIG. 5 in accordance with the present invention.

DETAILED DESCRIPTION OF THE PREFERRED EMBODIMENTS

The present invention relates to integrated circuit level shifting circuitry for converting digital data signals with one voltage range (e.g. 0–1.2 volts) to digital data signals with another voltage range (e.g., 0–2.5 volts). The present invention also relates to methods for adjusting and operating such level shifting circuitry.

Digital integrated circuits typically handle data internally in the form of single-ended signals. Single-ended signals are referenced to ground. If a single-ended signal has a high voltage (e.g., a voltage near a positive power supply voltage), that signal is said to be "high" (i.e., it represents a logic "1"). If a single-ended signal has a low voltage (e.g., a voltage near ground), that signal is said to be "low" (i.e., it represents a logic "0"). The voltage swing of the digital signals (i.e., the difference between the high voltage level and the ground voltage) may be, for example, 1.2 volts.

A voltage swing of 1.2 volts may be suitable for the core logic in a programmable logic device or other integrated circuit. However, larger voltage swings are often needed. For example, voltage swings of 2.5 volts may be needed to interface with input-output circuitry on the integrated circuit or with the circuitry on another integrated circuit.

A circuit that changes one level of voltage swing (e.g., 1.2 volts) to another level (e.g., 2.5 volts) is called a level shifter.

Figure 1:
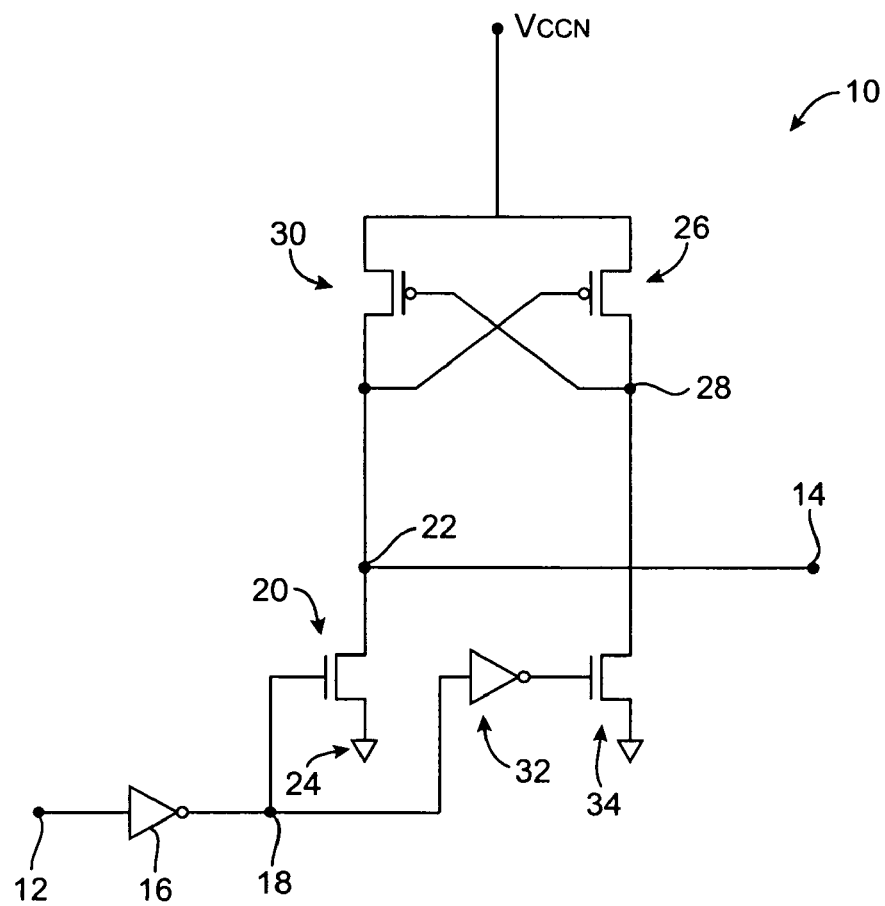
FIG. 1 is a circuit diagram of a conventional adjustable level shifter circuit.

A conventional level shifter 10 is shown in FIG. 1. Digital data input signals are received at input terminal 12. Corresponding level-shifted digital data output signals are provided at output terminal 14. The signals at terminals 12 and 14 are referenced to ground. When the voltage of the signal is high, the signal represents a logic one. When the voltage of the signal is low (i.e., at ground), the signal represents a logic zero.

The conventional level shifter 10 of FIG. 1 takes data input signals having a first voltage swing (e.g., 0–1.5 volts) and transforms them into digital output signals having a second voltage swing (i.e., 0 to Vccn volts). The level shifter 10 of FIG. 1 is adjustable, because Vccn is a user-adjustable voltage provided from an external input pin on the integrated circuit in which circuit 10 is contained.

Consider, as an example, the situation in which a low input signal (i.e., an input voltage at ground—0 volts) is applied to terminal 12. Inverter 16 inverts the low signal at terminal 12, so that the signal at node 18 is high. This high signal is applied to the gate of n-channel metal-oxide-semiconductor (NMOS) transistor 20, which turns transistor 20 on. With transistor 20 on, the voltage at node 22 is pulled low, toward the ground voltage at ground terminal 24. The output at terminal 14 is therefore low (ground).

When the voltage at node 22 is low, the gate of p-channel metal-oxide-semiconductor (PMOS) transistor 26 is low, which turns transistor 26 on and pulls node 28 high, to Vccn. With node 28 and the gate of PMOS transistor 30 held high, transistor 30 is turned off. The high voltage at node 18 is inverted by inverter 32, so the voltage at the gate of NMOS transistor 34 is low. This turns transistor 34 off.

Accordingly, when the input to circuit 10 is low (ground), the output of circuit 10 is also low (ground), transistors 30 and 34 are off, and transistors 20 and 26 are on.

When the input signal at terminal 12 changes to a high voltage, the voltage at node 18 will be low, turning transistors 20 and 26 off and turning transistors 30 and 34 on. Because transistor 30 is on, the voltage at node 22 and therefore the voltage at output terminal 14 is pulled high to Vccn. The value of Vccn may be adjusted by the user to control the voltage swing (0 to Vccn) at output terminal 14.

In the level shifter 10 of FIG. 1, transistors 20, 26, 30, and 34 are so-called "thick oxide" metal-oxide-semiconductor transistors. In modern semiconductor fabrication processes, some transistors have "thick" gate oxides, some have "thin" gate oxides, and some are so-called "native" devices. The thickness of the gate oxide of a thick oxide transistor is generally about three times greater than the thickness of a thin oxide transistor. The exact ratio of the thick to thin oxide thicknesses and the absolute thicknesses of the gate oxides on a given integrated circuit are process dependent. Due to their greater gate oxide thicknesses, thick oxide transistors are able to accommodate larger voltages than thin oxide transistors. Native devices are thick oxide transistors with a threshold voltage of about 0 volts, giving them an "always on" characteristic.

The transistors 20, 26, 30, and 34 in the conventional level shifter 10 of FIG. 1 are thick oxide devices.

During operation, the conventional level shifter 10 of FIG. 1 can exhibit excessive jitter. The performance of the conventional level shifter of FIG. 1 has been simulated using circuit modeling tools to study the relative importance of various factors affecting jitter. The results of these simulations are shown in the graph of FIG. 2.

Figure 2:
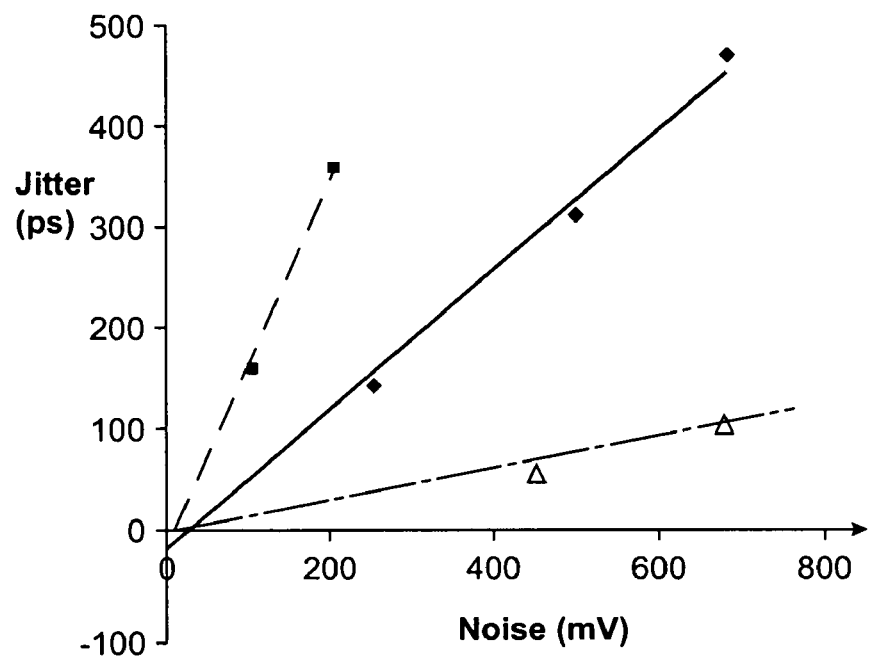
FIG. 2 is a graph showing calculated noise contributions for a level shifter of the type shown in FIG. 1.

As shown in FIG. 2, output signal jitter increases monotonically with increases of power supply noise. The triangular data points in the graph of FIG. 2 show how jitter increases as a function of increasing noise on the ground of circuit 10 (Vssn noise). The diamond data points represent the jitter contribution from noise on the adjustable power supply voltage Vccn. The square data points show the jitter contribution from noise on the input data signal voltage level (Vcc).

As the graph of FIG. 2 demonstrates, the largest contribution to jitter is due to Vcc noise. Analysis of the level shifter circuit of FIG. 1 reveals that Vcc noise has a large impact on jitter because noise on the buffers 16 and 32 is easily transmitted to the output at terminal 14 through NMOS transistors 20 and 34. Another reason that the conventional adjustable level shifter 10 of FIG. 1 may exhibit excessive jitter relates to the range of voltages permitted for Vccn. The PMOS and NMOS transistors in circuit 10 are both weaker at lower Vccn values, but because the PMOS and NMOS transistors weaken at different rates as Vccn is lowered, the circuit 10 cannot be optimized over the entire range of Vccn voltages.

Figure 3:
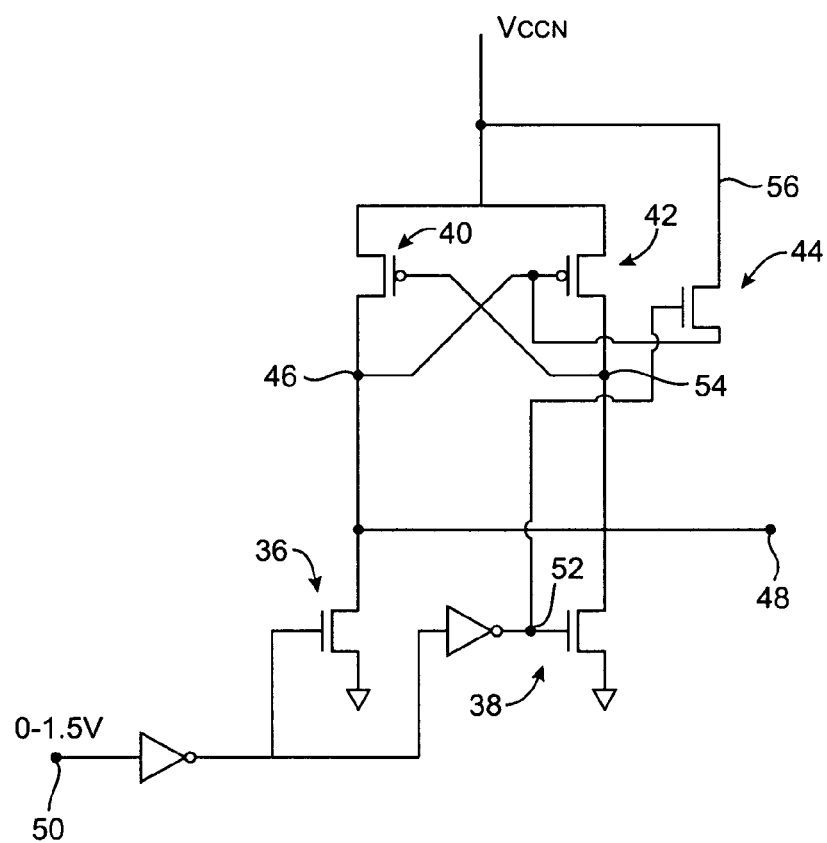
FIG. 3 is a circuit diagram of a conventional adjustable level shifter with a kicker transistor.

FIG. 3 shows another conventional adjustable level shifter circuit. The adjustable level shifter of FIG. 3, uses thick oxide NMOS transistors 36 and 38 and thick oxide PMOS transistors 40 and 42. A thick oxide NMOS transistor 44 is used as a kicker. When Vccn has been set to a low value, the process of switching output terminal 48 from low to high in response to a low to high transition at input terminal 50 is slowed by the poor switching performance of PMOS transistor 40. When input 50 is taken high, the voltage at node 52 goes high. This turns on transistor 38 and takes node 54 low. Taking node 54 low turns on transistor 40, which takes node 46 to Vccn and therefore takes output 48 to Vccn. However, at low values of Vccn, it is difficult to pull node 46 to Vccn in response to the low voltage presented at node 54, because PMOS transistor 40 is relatively weak under low Vccn biasing conditions. Transistor 44 assists transistor 40 under these conditions, because when node 52 goes high, transistor 44 is turned on, thereby helping to pull node 46 to Vccn through path 56.

The circuit of FIG. 3 is designed to operate with an input voltage swing of 1.5 volts, so its performance at input voltage swings of 1.2 volts would be suboptimal. Moreover, the transistors 40, 42, 36, and 38 are all thick oxide devices in an arrangement that makes the level shifter susceptible to Vcc noise, as explained in connection with FIGS. 1 and 2. As with NMOS transistors 20 and 34 of FIG. 1, NMOS transistors 36 and 38 of FIG. 3 cannot be thin oxide devices, because the drain-source voltages that would be encountered in situations in which Vccn is high (e.g., 3.3 volts) would permanently damage these transistors.

Figure 4:
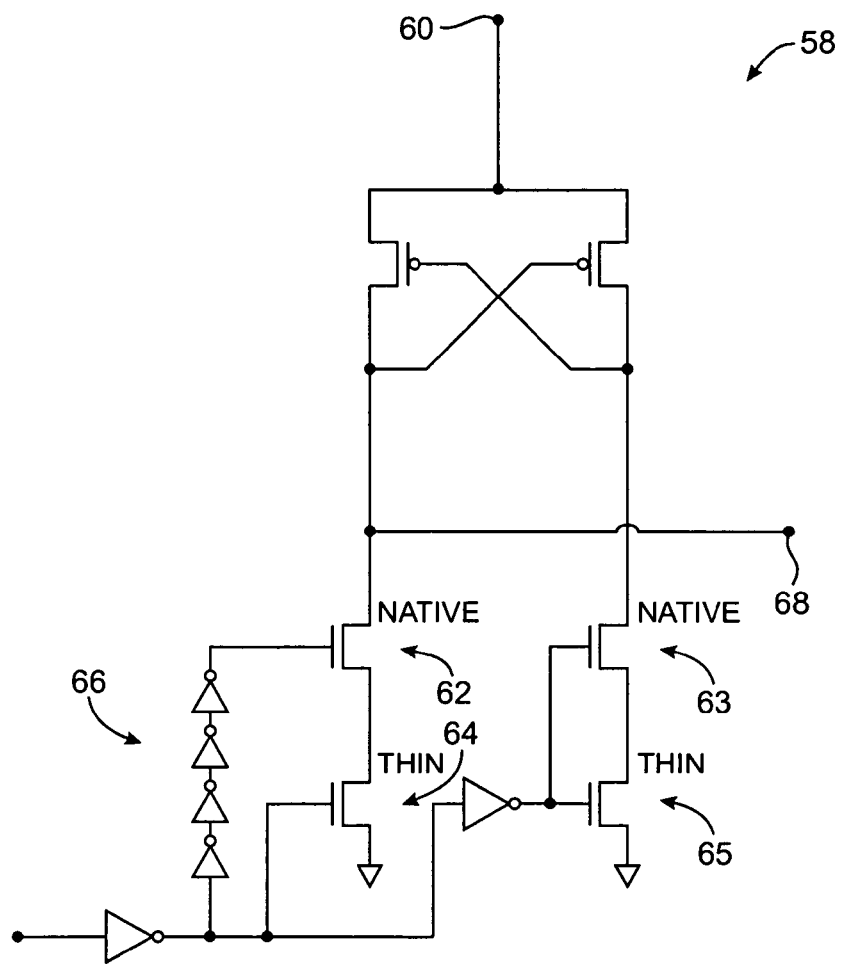
FIG. 4 is a circuit diagram of a conventional non-adjustable level shifter.

A conventional non-adjustable level shifter is shown in FIG. 4. The level shifter 58 of FIG. 4 is driven by a fixed power supply voltage at terminal 60, so the voltage swing provided at output terminal 68 is fixed and cannot be adjusted to accommodate different desired output voltage conditions. Circuit 58 has native devices 62 and 63 and thin oxide devices 64 and 65 arranged in series. Delay circuit 66 is used to ensure that device 62 is driven slowly enough to preserve the desired shape of the output signal.

Figure 5:
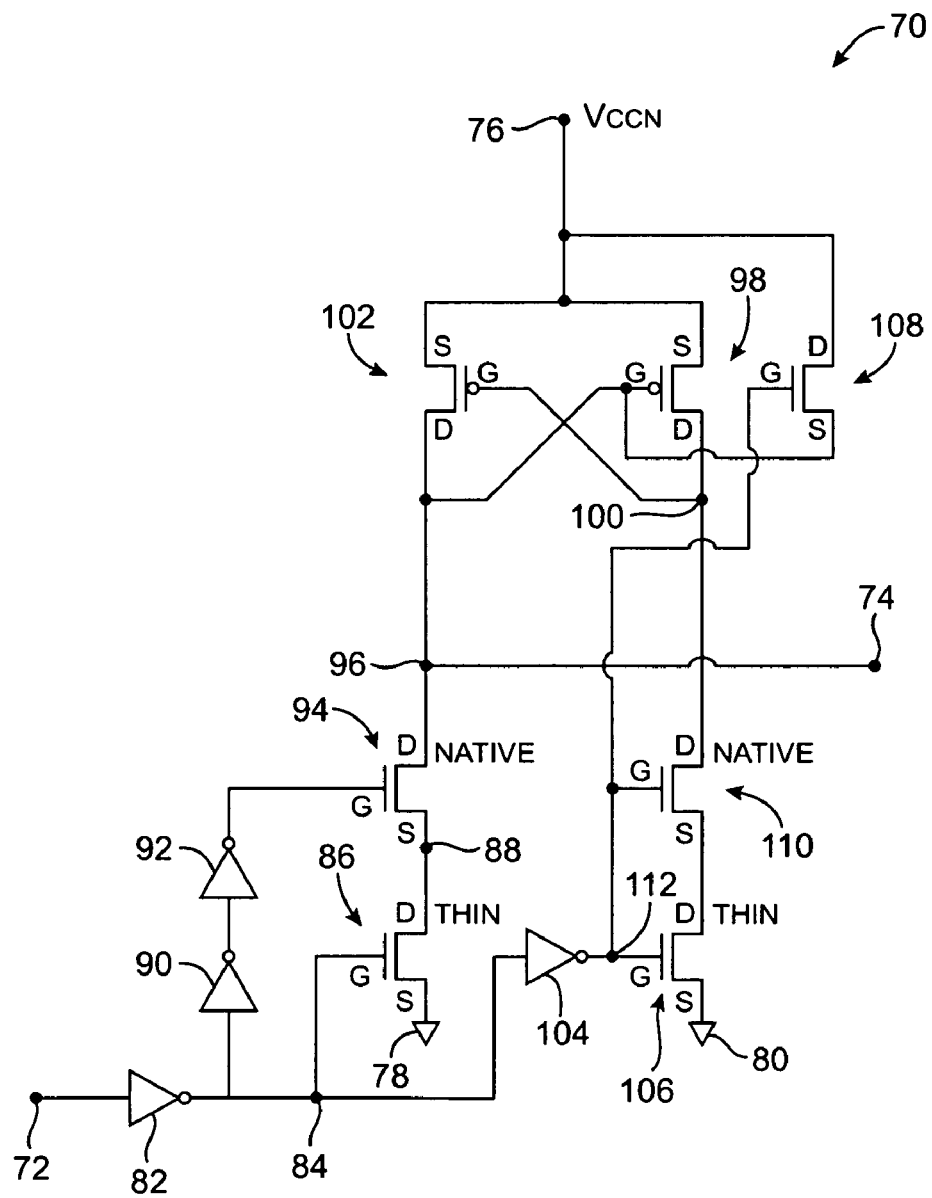
FIG. 5 is a circuit diagram of an adjustable level shifter in accordance with the present invention.

A low-jitter adjustable level shifter 70 in accordance with the present invention is shown in FIG. 5. Level shifter 70 receives digital data input signals at input terminal 72. Corresponding level-shifted digital data output signals are provided at output terminal 74. The magnitude of the output level is adjusted by adjusting the voltage Vccn that is applied to adjustable power supply voltage terminal 76 (e.g., using a Vccn voltage supplied from an external source through a power supply pin on the integrated circuit on which level shifter 70 is provided). The signals at terminals 72 and 74 are referenced to ground. The ground terminal for circuit 70 is shown by symbols 78 and 80. The transistors of FIG. 5 are metal-oxide-semiconductor transistors labeled to show their gates (G), sources (S), and drains (D). As shown in FIG. 5, for example, node 96 is located between the drain terminal of transistor 102 and the drain terminal of transistor 94.

When the voltage of an input data bit at input 72 is high, the bit represents a logic one. When the voltage of the input signal is low (i.e., at ground), the signal represents a logic zero. (If desired, high bits may be used to represent logic zeros and low bits may be used to represent logic ones.)

The level shifter 70 of FIG. 5 has switching circuitry (based on transistors 102, 98, 108, 94, 110, 86, and 106) that takes data input signals having a first voltage swing such as 0–1.2 volts and transforms them into digital output signals having a second voltage swing (i.e., 0 to Vccn volts). The level shifter 70 of FIG. 5 is adjustable, because Vccn is a user-adjustable parameter provided from an external input pin on the integrated circuit in which circuit 70 is contained. The value of Vccn may be adjusted to be equal to 1.5 volts, 1.8 volts, 2.3 volts, 2.5 volts, or any other suitable value.

The terminals 72 and 74 may be connected to any suitable circuitry. For example, terminal 72 may receive digital signals from core logic on a programmable logic device. The voltage swing of the core logic may be 1.2 volts or other suitable value. Terminal 74 may be provided to other logic on a programmable logic device integrated circuit. For example, terminal 74 may be connected to input-output circuitry operating at Vccn. The input-output circuitry may contain, for example, differential and/or single-ended output drivers that receive signals from terminal 74 (either directly or through intermediate circuits).

Level shifter 70 transforms the level of digital data signals at input 72 and provides corresponding level-shifted output signals at output 74. As an example, consider the situation in which a low input signal (an input voltage at ground, e.g., 0 volts) is applied to terminal 72. Inverter 82 inverts the low signal at terminal 72, so that the signal at node 84 is high. This high signal is applied to the gate of thin-oxide NMOS transistor 86, which turns transistor 86 on. With transistor 86 on, the voltage at node 96 is pulled low, toward the ground voltage at ground 78. After a delay introduced by cascaded inverters 90 and 92, the high signal at node 84 is applied to the gate of native NMOS transistor 94. The delay introduced by inverters 90 and 92 prevents the falling edge of the output signal from being too steep, which would tend to adversely affect the shape of the output signal.

The threshold voltage of native transistor 94 is about 0 volts, giving native transistor 94 an "always on" characteristic. The high signal applied to the gate of native device 94 further turns on device 94 and, because device 86 is on, pulls node 96 low to the ground voltage at ground 78. Node 96 is connected to output terminal 74, so the low input signal applied to terminal 72 results in a low output signal at output terminal 74.

When the voltage at node 96 is low, the gate of p-channel metal-oxide-semiconductor (PMOS) transistor 98 is low, which turns transistor 98 on and pulls node 100 high to Vccn at node 76. With node 100 and the gate of PMOS transistor 102 held high, transistor 102 is turned off. The high voltage at node 84 is inverted by inverter 104, so the voltage on node 112 at the gate of NMOS transistor 106 is low. This turns transistors 106 and 108 off.

As this demonstrates, when the input to circuit 70 is low (ground), the output of circuit 70 is also low (ground), transistors 102, 106, and 108 are off, and transistors 86 and 98 are on. Native transistors 94 and 110 are always on.

When the input signal at input 72 changes to a high voltage (e.g., 1.2 volts), the voltage at node 84 will be low, turning transistors 86 and 98 off and turning transistors 102, 106, and 108 on. Because transistor 102 is on, the voltage at node 96 and therefore the voltage at output terminal 74 is pulled high to the user-adjusted value of Vccn. Thick oxide NMOS transistor 108 serves as a kicker transistor and assists transistor 102 in taking node 96 high, particularly under low Vccn conditions.

When Vccn is low, the process of switching output terminal 74 from low to high in response to a low to high transition at input terminal 72 tends to be slowed by the relatively lower speed switching performance of PMOS transistor 102 under low Vccn conditions. When input 72 is taken high, the voltage at node 112 goes high. This turns on transistor 106. Because transistor 110 is always on, turning on transistor 106 takes node 100 low. Taking node 100 low turns on transistor 102, which takes node 96 and output 74 to Vccn. At low values of Vccn, it is difficult to pull node 96 to Vccn solely in response to the low voltage presented at node 100, because PMOS transistor 102 is relatively weak under low Vccn biasing conditions. Kicker transistor 108 is therefore provided to assist transistor 102 under these conditions. When node 112 goes high, the gate of transistor 108 goes high, which turns on transistor 108. Turning on transistor 108 provides another low resistance path between node 96 and terminal 76 (parallel to the path through transistor 102), thereby helping to pull node 96 and output 74 to Vccn.

The circuit of FIG. 5 operates over a range of Vccn voltages, which allows Vccn to be adjusted as needed for a given application. Transistors 102 and 98 are thick oxide PMOS devices. Transistors 88 and 112 are thin oxide devices, but are insulating from exposure from damaging drain-source voltage levels by the presence of thick-oxide native devices 94 and 110. Although the threshold voltages of thin-oxide transistors 86 and 106 are relatively low compared to those of thick oxide transistors, which tends to increase jitter due to Vcc noise, the presence of native transistors 94 and 110 tends to isolate circuit 70 from Vcc noise effects. On balance, improved the noise immunity provided by native devices 94 and 110 outweighs the reduced noise immunity due to using thin oxide devices for transistors 86 and 112, thereby improving the performance of level shifter 70. Because the isolation provided by transistors 94 and 110 more than compensates for the potentially increased jitter contribution from thin oxide devices 86 and 106, the jitter of level shifter 70 is reduced relative to conventional level shifters.

The performance of the level shifter 70 of FIG. 5 has been simulated using circuit modeling tools. Simulation results are shown in FIGS. 6 and 7.

Figure 6:
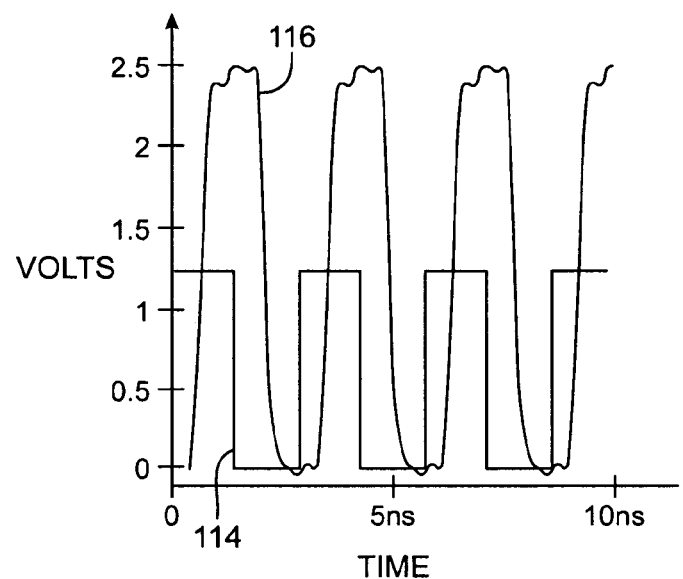
FIG. 6 is a graph showing the calculated performance of the circuit of FIG. 5 when the adjustable power supply voltage is set to 2.5 volts in accordance with the present invention.

The graph of FIG. 6 shows an input square wave signal 114 and a corresponding output signal 116. The input square wave signal 114 has a voltage swing of 0–1.2 volts and is applied to input 72 of circuit 70 (FIG. 5). After level shifting by level shifter 70, the output signal 116 is produced at output 74 (FIG. 5). The voltage Vccn in this example is set to 2.5 volts, so the voltage swing of output signal 116 is 2.5 volts. As shown in FIG. 6, the level shifter 70 is able to toggle as fast as 350 MHz at a Vccn setting of 2.5 volts.

Figure 7:
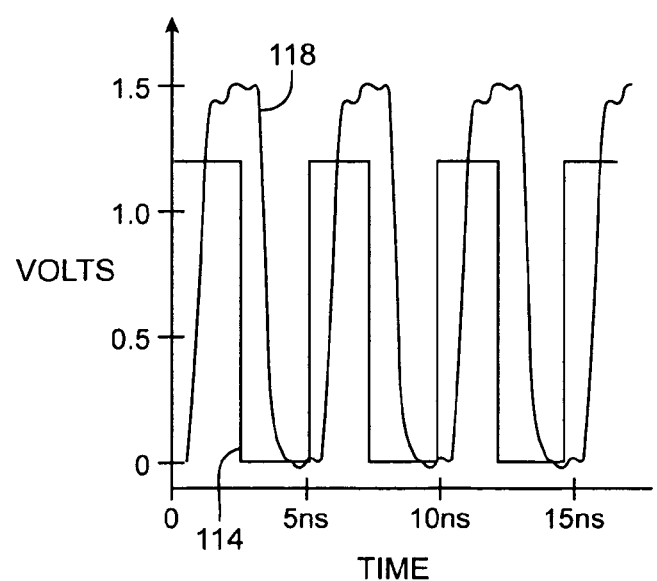
FIG. 7 is a graph showing the calculated performance of the circuit of FIG. 5 when the adjustable power supply voltage is set to 1.5 volts in accordance with the present invention.

The graph of FIG. 7 shows an input square wave signal 114 and a corresponding output signal 118. As in the example of FIG. 6, the input square wave signal 114 has a voltage swing of 1.2 volts. After level shifting by level shifter 70, the output signal 118 is produced at output 74 (FIG. 5). The voltage Vccn in this example is set to 1.5 volts, so the voltage swing of output signal 118 is 1.5 volts. Because the magnitude of Vccn is less than in the FIG. 6 example, the transistors in level shifter 70 are not able to switch as rapidly as in FIG. 6. Nevertheless, the graph of FIG. 7 demonstrates that the level shifter 70 is able to toggle as fast as 200 MHz at a Vccn setting of 1.5 volts.

An important figure of merit for a level shifter is its jitter. Excessive jitter will introduce errors into the data stream, even if the switching speed of the level shifter is high. The jitter performance of level shifter 70 of FIG. 5 has been compared to the jitter performance of the conventional level shifter 10 of FIG. 1 using circuit modeling tools. Jitter performance results for the conventional level shifter 10 are shown in FIG. 8. Jitter performance results for the level shifter 70 of FIG. 5 are shown in FIG. 9.

As shown in FIG. 8, the jitter of the conventional level shifter 10 under a given set of power supply noise conditions is about 600 ps. In comparison, as shown in FIG. 9, the jitter of the level shifter 70 under the same power supply noise conditions is about 350 ps. The switching speeds (rise and fall times) of the level shifters 10 and 70 are shown at the columns of FIGS. 8 and 9 labeled Vcc=1.3 volts and Vcc=0.9 volts. When the voltage swing of the input data is 1.3 volts, the conventional level shifter is marginally faster than level shifter 70 (about 1275 ps versus 1375 ps). However, when the voltage swing of the input data is 0.9 volts, the conventional level shifter is slower than the level shifter 70 (about 1885 ps versus 1725 ps).

The ratio of low Vcc operation to high Vcc operation provides a good overall measure of performance. As shown by the tables of FIGS. 8 and 9, the ratio for the level shifter 70 (about 1725/1375) is no worse than the ratio for the conventional level shifter 10 (about 1885/1275), even though the jitter of level shifter 70 is substantially improved with respect to the conventional level shifter 10.

The level shifter 70 exhibits less jitter than the conventional level shifter and therefore offers better noise immunity. The level shifter 70 also operates over a wide voltage supply range (Vccn). A slight increase in circuit real estate is required over the conventional design of FIG. 1 to accommodate kicker 108 and native transistors 94 and 110, but this increase provides significantly improved performance.

The foregoing is merely illustrative of the principles of this invention and various modifications can be made by those skilled in the art without departing from the scope and spirit of the invention.

What is claimed is:

1. An adjustable integrated circuit level shifter that receives input data signals and that provides corresponding level-shifted output data signals, comprising:
switching circuitry that receives the input data signals and an adjustable power supply voltage and that provides corresponding output data signals having a voltage swing set by the adjustable power supply voltage, wherein the switching circuitry includes two p-channel metal-oxide-semiconductor (PMOS) transistors, two native n-channel metal-oxide-semiconductor (NMOS) transistors, two thin-oxide NMOS transistors, and an NMOS kicker transistor connected in parallel with one of the PMOS transistors.

2. The adjustable integrated circuit level shifter defined in claim 1 wherein the NMOS kicker transistor comprises a thick-oxide transistor.

3. The adjustable integrated circuit level shifter defined in claim 1 wherein the PMOS transistors each comprise a gate and a drain wherein the gate of each of the PMOS transistors is connected to the drain of the other PMOS transistor.

4. The adjustable integrated circuit level shifter defined in claim 1 wherein one of the thin-oxide NMOS transistors comprises a gate, the adjustable integrated circuit level shifter further comprising:
an input terminal that receives the input data signals; and
a delay circuit connected between the input terminal and the gate of the thin-oxide NMOS transistor.

5. The adjustable integrated circuit level shifter defined in claim 1 further comprising:
an input terminal that receives the input data signals; and
an inverter connected to the input terminal that inverts the received input data signals and applies the inverted input data signals to one of the thin-oxide NMOS transistors.

6. The adjustable integrated circuit level shifter defined in claim 1 further comprising:
an input terminal that receives the input data signals;
a first inverter connected to the input terminal that inverts the received input data signals and applies the inverted input data signals to one of the thin-oxide NMOS transistors; and
a second inverter that receives the inverted input data signals from the first inverter and inverts the inverted input data signals to produce signals that are applied to the other of the thin-oxide NMOS transistors.

7. An adjustable integrated circuit level shifter, comprising:
an input terminal that receives input data signals having a first voltage swing;
an adjustable power supply voltage terminal that receives an adjustable power supply voltage;
a ground;
an output terminal at which level-shifted output data signals corresponding to the input data signals are provided, wherein the output data signals have a voltage swing set by the adjustable power supply voltage;
a first thick-oxide p-channel metal-oxide-semiconductor transistor, a first thick-oxide native n-channel metal-oxide-semiconductor transistor, and a first thin-oxide n-channel metal-oxide-semiconductor transistor connected in series between the adjustable power supply voltage terminal and the ground;
a second thick-oxide p-channel metal-oxide-semiconductor transistor, a second thick-oxide native n-channel metal-oxide-semiconductor transistor, and a second thin-oxide n-channel metal-oxide-semiconductor transistor connected in series between the adjustable power supply voltage terminal and the ground, wherein the first and second thin-oxide n-channel metal-oxide-semiconductor transistors have gates driven by the input data signal and an inverted version of the input data signal and wherein the output terminal is connected to a node located between the first thick-oxide p-channel metal-oxide semiconductor transistor and the first thick-oxide native n-channel metal-oxide-semiconductor transistor; and an n-channel metal-oxide-semiconductor kicker transistor that is connected between the adjustable power supply terminal and a gate of the second thick-oxide p-channel metal-oxide-semiconductor transistor and that has a gate driven by the input data signal.

8. The adjustable integrated circuit level shifter defined in claim 7 wherein the transistors each comprise a gate, a drain, and a source and wherein the source of the first p-channel metal-oxide-semiconductor is connected to the adjustable power supply voltage terminal and the drain of the first p-channel metal-oxide-semiconductor is connected to the drain of the first native transistor.

9. The adjustable integrated circuit level shifter defined in claim 7 wherein the gate of the kicker transistor is connected to a gate of the second native transistor and the gate of the second thin-oxide transistor.

10. The adjustable integrated circuit level shifter defined in claim 7 wherein the gate of the kicker transistor is connected to a gate of the second native transistor, a drain of the kicker transistor is connected to the adjustable power supply voltage terminal, and a source of the kicker transistor is connected to the gate of the second p-channel metal-oxide-semiconductor transistor.

11. The adjustable integrated circuit level shifter defined in claim 7 further comprising a delay circuit that delays signals applied to a gate of the first native transistor.

12. The adjustable integrated circuit level shifter defined in claim 7 further comprising two cascaded inverters connected between the gate of the first thin-oxide transistor and a gate of the first native transistor that delay signals applied to the gate of the first native transistor.

13. The adjustable integrated circuit level shifter defined in claim 7 further comprising:

a first inverter having an input and an output, wherein the input of the first inverter is connected to the input terminal and the output of the first inverter is connected to the gate of the first thin-oxide transistor; and a second inverter having an input and an output, wherein the input of the second inverter is connected to the output of the first inverter and wherein the output of the second inverter is connected to the gate of the second thin-oxide transistor.

14. The adjustable integrated circuit level shifter defined in claim 7 further comprising:

a first inverter having an input and an output, wherein the input of the first inverter is connected to the input terminal and the output of the first inverter is connected to the gate of the first thin-oxide transistor;

a second inverter having an input and an output, wherein the input of the second inverter is connected to the output of the first inverter and wherein the output of the second inverter is connected to the gate of the second thin-oxide transistor; and a delay circuit connected between the output of the first inverter and the gate of the first thin-oxide metal-oxide-semiconductor transistor.

15. The adjustable integrated circuit level shifter defined in claim 7 further comprising:

a first inverter having an input and an output, wherein the input of the first inverter is connected to the input terminal and the output of the first inverter is connected to the gate of the first thin-oxide transistor;

a second inverter having an input and an output, wherein the input of the second inverter is connected to the output of the first inverter and wherein the output of the second inverter is connected to the gate of the second thin-oxide transistor; and two cascaded inverters connected between the output of the first inverter and the gate of the first thin-oxide metal-oxide-semiconductor transistor.

16. The adjustable integrated circuit level shifter defined in claim 7 wherein the transistors each comprise a gate, a drain, and a source and wherein the gate of the first p-channel metal-oxide-semiconductor transistor is connected to the drain of the second p-channel metal-oxide-semiconductor transistor, wherein the gate of the second p-channel metal-oxide-semiconductor transistor is connected to the drain of the first p-channel metal-oxide-semiconductor transistor, wherein the drain of the kicker transistor is connected to the adjustable power supply voltage terminal, wherein the gate of the kicker transistor is connected to the gate of the second native transistor and the gate of the second thin-oxide transistor, and wherein the source of the kicker transistor is connected to the gate of the second p-channel metal-oxide-semiconductor transistor.

17. The adjustable integrated circuit level shifter defined in claim 7 wherein the transistors each comprise a gate, a drain, and a source and wherein the gate of the first p-channel metal-oxide-semiconductor transistor is connected to the drain of the second p-channel metal-oxide-semiconductor transistor, wherein the gate of the second p-channel metal-oxide-semiconductor transistor is connected to the drain of the first p-channel metal-oxide-semiconductor transistor, wherein the drain of the kicker transistor is connected to the adjustable power supply voltage terminal, wherein the gate of the kicker transistor is connected to the gate of the second native transistor and the gate of the second thin-oxide transistor, wherein the source of the kicker transistor is connected to the gate of the second p-channel metal-oxide-semiconductor transistor, and wherein the output terminal is connected to the drain of the first p-channel metal-oxide-semiconductor transistor, the adjustable integrated circuit level shifter further comprising an inverter having an input connected to the input terminal and an output connected to the gate of the first thin-oxide transistor.

18. The adjustable integrated circuit level shifter defined in claim 7 wherein the transistors each comprise a gate, a drain, and a source and wherein the gate of the first p-channel metal-oxide-semiconductor transistor is connected to the drain of the second p-channel metal-oxide-semiconductor transistor, wherein the gate of the second p-channel metal-oxide-semiconductor transistor is connected to the drain of the first p-channel metal-oxide-semiconductor transistor, wherein the drain of the kicker transistor is connected to the adjustable power supply voltage terminal, wherein the gate of the kicker transistor is connected to the gate of the second native transistor and the gate of the second thin-oxide transistor, wherein the source of the kicker transistor is connected to the gate of the second p-channel metal-oxide-semiconductor transistor, and wherein the output terminal is connected to the drain of the first p-channel metal-oxide-semiconductor transistor, the adjustable integrated circuit level shifter further comprising:

a first inverter having an input and an output, wherein the input of the first inverter is connected to the input terminal and the output of the first inverter is connected to the gate of the first thin-oxide transistor; and a second inverter having an input and an output, wherein the input of the second inverter is connected to the output of the first inverter and wherein the output of the second inverter is connected to the gate of the second thin-oxide transistor.

19. The adjustable integrated circuit level shifter defined in claim 7 wherein the transistors each comprise a gate, a drain, and a source and wherein the gate of the first p-channel metal-oxide-semiconductor transistor is connected to the drain of the second p-channel metal-oxide-semiconductor transistor, wherein the gate of the second p-channel metal-oxide-semiconductor transistor is connected to the drain of the first p-channel metal-oxide-semiconductor transistor, wherein the drain of the kicker transistor is connected to the adjustable power supply voltage terminal, wherein the gate of the kicker transistor is connected to the gate of the second native transistor and the gate of the second thin-oxide transistor, wherein the source of the kicker transistor is connected to the gate of the second p-channel metal-oxide-semiconductor transistor, and wherein the output terminal is connected to the drain of the first p-channel metal-oxide-semiconductor transistor, the adjustable integrated circuit level shifter further comprising:
- a first inverter having an input and an output, wherein the input of the first inverter is connected to the input terminal and the output of the first inverter is connected to the gate of the first thin-oxide transistor;
- a second inverter having an input and an output, wherein the input of the second inverter is connected to the output of the first inverter and wherein the output of the second inverter is connected to the gate of the second thin-oxide transistor; and
- a delay circuit connected between the output of the first inverter and the gate of the first thin-oxide metal-oxide-semiconductor transistor.

20. The adjustable integrated circuit level shifter defined in claim 7 wherein the transistors each comprise a gate, a drain, and a source and wherein the gate of the first p-channel metal-oxide-semiconductor transistor is connected to the drain of the second p-channel metal-oxide-semiconductor transistor, wherein the gate of the second p-channel metal-oxide-semiconductor transistor is connected to the drain of the first p-channel metal-oxide-semiconductor transistor, wherein the drain of the kicker transistor is connected to the adjustable power supply voltage terminal, wherein the gate of the kicker transistor is connected to the gate of the second native transistor and the gate of the second thin-oxide transistor, wherein the source of the kicker transistor is connected to the gate of the second p-channel metal-oxide-semiconductor transistor, and wherein the output terminal is connected to the drain of the first p-channel metal-oxide-semiconductor transistor, the adjustable integrated circuit level shifter further comprising:
- a first inverter having an input and an output, wherein the input of the first inverter is connected to the input terminal and the output of the first inverter is connected to the gate of the first thin-oxide transistor;
- a second inverter having an input and an output, wherein the input of the second inverter is connected to the output of the first inverter and wherein the output of the second inverter is connected to the gate of the second thin-oxide transistor; and
- two cascaded inverters connected between the output of the first inverter and the gate of the first thin-oxide metal-oxide-semiconductor transistor.

* * * * *